(12) United States Patent
Lee et al.

(10) Patent No.: US 9,069,045 B2
(45) Date of Patent: *Jun. 30, 2015

(54) VOLTAGE SENSING ASSEMBLY AND BATTERY MODULE EMPLOYED WITH THE SAME

(71) Applicant: LG CHEM, LTD., Seoul (KR)

(72) Inventors: BumHyun Lee, Seoul (KR); Jong Moon Yoon, Daejeon (KR); Yong Shik Shin, Daejeon (KR); Jin Kyu Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 279 days.

This patent is subject to a terminal disclaimer.

(21) Appl. No.: 13/756,584

(22) Filed: Feb. 1, 2013

(65) Prior Publication Data

US 2013/0143086 A1 Jun. 6, 2013

Related U.S. Application Data

(63) Continuation of application No. PCT/KR2011/005893, filed on Aug. 11, 2011.

(30) Foreign Application Priority Data

Aug. 16, 2010 (KR) ......................... 10-2010-0078625

(51) Int. Cl.
*H01M 10/48* (2006.01)
*G01R 31/36* (2006.01)
(Continued)

(52) U.S. Cl.
CPC ........... *G01R 31/362* (2013.01); *H01M 2/1077* (2013.01); *H01M 10/482* (2013.01);
(Continued)

(58) Field of Classification Search
CPC .................. H01M 10/482; G01R 31/362
See application file for complete search history.

(56) References Cited

U.S. PATENT DOCUMENTS 7,892,669 B2 * 2/2011 Yang et al. ..................... 429/100
8,329,324 B2 * 12/2012 Lee et al. ........................ 429/61
(Continued)

FOREIGN PATENT DOCUMENTS

KR 10-2007-0110565 A 11/2007
KR 10-2007-0114409 A 12/2007
(Continued)

OTHER PUBLICATIONS

International Search Report issued in PCT/KR2011/005893, mailed on Dec. 28, 2011.

*Primary Examiner* — Ula C Ruddock
*Assistant Examiner* — Osei Amponsah
(74) *Attorney, Agent, or Firm* — Birch, Stewart, Kolasch & Birch, LLP

(57) ABSTRACT

Disclosed herein is a voltage sensing assembly to detect voltages of battery cells having electrode terminals formed at an upper end or a lower end thereof in a state in which the voltage sensing assembly is mounted to a battery module, the voltage sensing assembly including (a) a block case, formed of an electrically insulative material, mounted to a front or rear of the battery module corresponding to electrode terminal connection parts of the battery cells, (b) conductive sensing parts connected to voltage sensing terminals located at one-side ends of bus bars electrically connected to the electrode terminal connection parts of the battery cells, and (c) a connector to transmit voltages sensed by the conductive sensing parts to a controller, wherein the block case includes mounting grooves, opened to a front, formed at positions of the block case corresponding to the voltage sensing terminals of the bus bars such that the conductive sensing parts are mounted in the mounting grooves, and the conductive sensing parts are connected to the voltage sensing terminals of the bus bars in a state in which the conductive sensing parts are mounted in the mounting grooves of the block case.

23 Claims, 7 Drawing Sheets

(51) Int. Cl.
    *H01M 2/10*     (2006.01)
    *H01M 10/625*     (2014.01)
    *H01M 10/655*     (2014.01)
    *H01M 10/6555*     (2014.01)
    *H01M 10/613*     (2014.01)
    *H01M 10/647*     (2014.01)

(52) U.S. Cl.
    CPC ....... *H01M10/5016* (2013.01); *H01M 10/5044* (2013.01); *H01M 10/5055* (2013.01); *G01R 31/3696* (2013.01); *H01M 10/5004* (2013.01); *H01M 10/5032* (2013.01); *H01M 2220/20* (2013.01)

(56) References Cited

U.S. PATENT DOCUMENTS

| | | |
|---|---|---|
| 8,455,122 B2 * | 6/2013 | Shin et al. .................. 429/61 |
| 2009/0214936 A1 | 8/2009 | Yang et al. |
| 2009/0325043 A1 | 12/2009 | Yoon et al. |
| 2010/0151299 A1 | 6/2010 | Ha et al. |

FOREIGN PATENT DOCUMENTS

| KR | 10-2008-0025429 A | 3/2008 |
|---|---|---|
| KR | 10-2008-0038467 A | 5/2008 |

\* cited by examiner

200

VOLTAGE SENSING ASSEMBLY AND BATTERY MODULE EMPLOYED WITH THE SAME

CROSS REFERENCE TO RELATED APPLICATIONS

This application is a Continuation of PCT International Application No. PCT/KR2011/005893 filed on Aug. 11, 2011, which claims priority under 35 U.S.C. §119(a) to Patent Application No. 10-2010-0078625 filed in the Republic of Korea on Aug. 16, 2010, all of which are hereby expressly incorporated by reference into the present application.

TECHNICAL FIELD

The present invention relates to a voltage sensing assembly to detect voltages of battery cells having electrode terminals formed at an upper end or a lower end thereof in a state in which the voltage sensing assembly is mounted to a battery module, the voltage sensing assembly including a block case formed of an electrically insulative material, conductive sensing parts connected to voltage sensing terminals located at one-side ends of bus bars, and a connector to transmit voltages sensed by the conductive sensing parts to a controller, wherein the block case includes mounting grooves, opened to a front, formed at positions of the block case corresponding to the voltage sensing terminals of the bus bars such that the conductive sensing parts are mounted in the mounting grooves, and the conductive sensing parts are connected to the voltage sensing terminals of the bus bars in a state in which the conductive sensing parts are mounted in the mounting grooves of the block case.

BACKGROUND ART

Recently, a secondary battery, which can be charged and discharged, has been widely used as an energy source for wireless mobile devices. Also, the secondary battery has attracted considerable attention as a power source for electric vehicles (EV), hybrid electric vehicles (HEV), and plug-in hybrid electric vehicles (Plug-In HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, uses a middle or large-sized battery module having a plurality of battery cells electrically connected to one another because high power and large capacity are necessary for the middle or large-sized devices.

Preferably, the battery module is manufactured so as to have as small a size and weight as possible. For this reason, a prismatic battery or a pouch-shaped battery, which can be stacked with high integration and has a small weight to capacity ratio, is usually used as a battery cell of the middle or large-sized battery module. In particular, much interest is currently focused on the pouch-shaped battery, which uses an aluminum laminate sheet as a sheathing member, because the pouch-shaped battery is lightweight, and the manufacturing costs of the pouch-shaped battery are low.

Also, the battery module is constituted by combining a plurality of battery cells, and therefore, safety and operational efficiency of the battery module assembly is greatly lowered when some of the battery cells suffer from overvoltage, overcurrent, or overheating. For this reason, means to sense and control overvoltage, overcurrent, or overheating are needed. Consequently, voltage sensors are connected to the battery cells to check and control operational states of the battery cells in real time or at predetermined intervals. Installation or connection of such sensing means very complicate a process of assembling the battery module. Furthermore, a plurality of wires is needed to install or connect the sensing means with the result that a short circuit may occur in the battery module. Also, the secondary battery is used as a power source for vehicles as a result of extension of the application range of the secondary battery. When strong impact or vibration is applied to the battery module, therefore, fastening means to stably maintain contact of the sensing means are needed.

In addition, in a case in which the battery module is constructed using a plurality of battery cells or a plurality of cell modules, each of which includes a predetermined number of battery cells, a plurality of members for mechanical fastening and electrical connection therebetween is generally needed with the result that a process of assembling the mechanical fastening and electrical connection members is very complicated.

Furthermore, there is needed a space for coupling, welding, or soldering of the mechanical fastening and electrical connection members with the result that the total size of the battery system is increased. The increase in size of the battery system is not preferred in the above regard. Consequently, there is a high necessity for a voltage sensing assembly which is compact and has excellent structural stability and a battery module including the same.

DISCLOSURE

Technical Problem

Therefore, the present invention has been made to solve the above problems and other technical problems that have yet to be resolved.

Specifically, it is an object of the present invention to provide a voltage sensing assembly that can be manufactured using a simple assembly method without using a plurality of members for mechanical fastening and electrical connection.

It is another object of the present invention to provide a voltage sensing assembly that is configured as a separate assembly, thereby greatly improving productivity and maintenance of a battery module.

It is a further object of the present invention to provide a battery module that includes the voltage sensing assembly and can be manufactured based on desired power and capacity.

Technical Solution

In accordance with one aspect of the present invention, the above and other objects can be accomplished by the provision of a voltage sensing assembly to detect voltages of battery cells having electrode terminals formed at an upper end or a lower end thereof in a state in which the voltage sensing assembly is mounted to a battery module, the voltage sensing assembly including (a) a block case, formed of an electrically insulative material, mounted to a front or rear of the battery module corresponding to electrode terminal connection parts of the battery cells, (b) conductive sensing parts connected to voltage sensing terminals located at one-side ends of bus bars electrically connected to the electrode terminal connection parts of the battery cells, and (c) a connector to transmit voltages sensed by the conductive sensing parts to a controller, wherein the block case includes mounting grooves, opened to a front, formed at positions of the block case corresponding to the voltage sensing terminals of the bus bars such that the conductive sensing parts are mounted in the mounting grooves, and the conductive sensing parts are connected to the voltage sensing terminals of the bus bars in a state in which the conductive sensing parts are mounted in the mounting grooves of the block case.

That is, the voltage sensing assembly according to the present invention is configured to have a structure in which the conductive sensing parts are connected to the voltage sensing terminals of the bus bars in a state in which the conductive sensing parts are mounted in the mounting grooves of the block case. Consequently, the assembly process of the voltage sensing assembly is simplified, and the voltage sensing assembly has a structure that is compact and is capable of stably sensing voltages.

Also, the members to sense voltages of the battery cells are configured to have a modular assembly structure, and therefore, the voltage sensing assembly can be easily mounted to the front or rear of a battery module.

Furthermore, the assembly structure configured as the individual part as described above can be provided by outside suppliers, thereby greatly improving productivity of the battery module. Also, when elements constituting the voltage sensing assembly are abnormal, it is possible to replace only the voltage sensing assembly mounted to the front or rear of the battery module without disassembly of the battery module, thereby greatly improving maintenance of the battery module, as compared with the conventional battery module structure.

In addition, the conductive sensing parts are fixed to the block case in a state in which the conductive sensing parts are arranged in the same line, and therefore, the voltage sensing assembly according to the present invention may be easily extended according to use environments, voltage and current, of the battery module.

The controller may be, for example, a battery management system (BMS).

The mounting grooves of the block case may be individually formed for each conductive sensing part, and therefore, each of the conductive sensing parts may be inserted into a corresponding one of the mounting grooves. The mounting grooves prevent contact between the conductive sensing parts.

In a preferred example, each of the conductive sensing parts may be configured to have a receptacle type structure in which each of the conductive sensing parts is inserted into a corresponding one of the voltage sensing terminals of the bus bars from the front of each of the conductive sensing parts. Even when external impact is applied to the battery module, therefore, electrical connection between the conductive sensing parts and the voltage sensing terminals is stably maintained.

Preferably, each of the conductive sensing parts includes a receptacle part inserted into a corresponding one of the voltage sensing terminals of the bus bars and a conduction wire, and the receptacle part is connected to the conduction wire in a state in which the receptacle part is perpendicular to the conduction wire.

Consequently, the conductive sensing parts are pushed to the block case from the front of the block case to achieve assembly between the conductive sensing parts and the block case, and therefore, an assembly process is simplified.

The structure of each of the conductive sensing parts is not particularly restricted so long as the conductive sensing parts are easily connected to the connector to transmit sensed voltages to the controller. For example, the conductive sensing parts may be connected to the connector via wires, and each of the wires may be wrapped with insulative tape for insulation from the outside or may be mounted in a tubular member. The tubular member may be, for example, a hollow insulative pipe.

In the above structure, the block case is preferably provided at the front thereof with clamp-shaped fastening members protruding forward to stably fix the wires.

Each of the bus bars may include a plate-shaped body electrically connected to an electrode terminal connection part of each of the battery cells and a voltage sensing terminal formed at one end of the plate-shaped body.

Also, each of the bus bars may protrude to the front, thereby easily achieving coupling between the bus bars and the block case.

In a preferred example, one of the bus bars, connected to a cathode or anode external input and output terminal, may further include a first external input and output terminal connection part formed at the other end of the plate-shaped body opposite to the voltage sensing terminal and bent so as to protrude outward from the body.

In the above structure, a depression having a small vertical sectional area to cause a short circuit in an overcurrent state is formed between the body and the first external input and output terminal connection part. Consequently, the depression is cut when overcurrent is generated, thereby improving safety of the battery module.

The depression may have a size equivalent to, for example, 10 to 50% the width of the body of each of the bus bars. In a case in which the vertical sectional area of the body of each of the bus bars is 10 mm$^2$, the vertical sectional area of the depression may be 4 mm$^2$ equivalent to 40% that of the body of each of the bus bars.

In another preferred example, one of the bus bars, connected to an anode or cathode external input and output terminal, may further include a second external input and output terminal connection part formed at the other end of plate-shaped body opposite to the voltage sensing terminal and bent so as to protrude outward and upward from the body.

In the first external input and output terminal connection part and the second external input and output terminal connection part may be formed fastening holes, in which the external input and output terminals are coupled.

In accordance with another aspect of the present invention, there is provided a battery module including the voltage sensing assembly with the above-stated construction.

A preferred example of the battery module may include a cell module stack having a structure in which a plurality of cell modules, each of which includes a battery cell mounted in a cartridge, is vertically stacked, a lower end plate to support a lower end of the cell module stack, and an upper end plate to fix an uppermost cartridge of the cell module stack disposed on the lower end plate For reference, at least some electrical connection portions of the battery cells in each cell module or between the cell modules are partially connected in series to each other. Electrode terminals of the battery cells are coupled to each other in a state in which the electrode terminals of the battery cells are arranged so as to be adjacent to each other, and a predetermined number of battery cells are covered by a cell cover, thereby manufacturing a plurality of cell modules. Some sequences of this manufacturing process may be changed. For example, a plurality of cell modules may be manufactured, and then electrical connection between the cell modules may be performed.

In a preferred example, each of the cartridges may be configured to have a rectangular structure corresponding to each of the battery cells such that the battery cell can be mounted in the cartridge and may be provided at a central region thereof with a through hole, through which heat is dissipated, fastening holes, through which fixing members to fix the cell module stack are inserted, may be formed in four corners of each of the cartridges, and a coupling part, to which an insulative mounting member to mount the voltage detection assembly and bus bars is fastened in an assembly fashion such that the voltage detection assembly is stably connected to the bus bars, may be formed at the front of each of the cartridges.

For example, the bus bars may be thermally welded to an injection molded material of the insulative mounting member.

The insulative mounting member may be configured to have a rectangular parallelepiped structure having a size corresponding to the front of the cell module stack, cartridge coupling grooves, into which front ends of the cartridges are inserted and coupled, may be formed at the rear of the insulative mounting member, and electrode terminal through holes, through which the electrode terminal connection parts of the battery cells are introduced from the rear of the insulative mounting member such that the electrode terminal connection parts of the battery cells are exposed, may be formed at opposite sides of the front of the insulative mounting member.

The insulative mounting member may be provided at opposite ends of the front thereof with location parts for external input and output terminals, in which the external input and output terminals of the bus bars are stably mounted, and the insulative mounting member may be provided at a central region thereof with a voltage detection assembly location part, in which the voltage detection assembly is stably mounted.

Fastening depressions are formed at the location parts for the external input and output terminal connection parts such that the external input and output terminal connection parts of the bus bars can be easily inserted into the fastening depressions.

Meanwhile, the electrode terminal connection parts of the battery cells exposed forward through the electrode terminal through holes may be electrically connected to the upper end surfaces of the bus bars mounted in the electrode terminal through holes.

The battery module according to the present invention is configured to have a structure in which the battery cells are mounted in the cartridges of the cell modules, the cartridges are stacked on the lower end plate, and the upper end plate is coupled to an uppermost one of the cartridges.

The block case may be provided at opposite ends thereof with fastening protrusions protruding outward so as to be coupled into slits of the insulative mounting member, and sliding protrusions protruding outward so as to be fastened into the inside of a voltage detection assembly location part of the insulative mounting member in a sliding fashion may be provided above the fastening protrusions.

Each of the battery cells may be a pouch-shaped battery cell having an electrode assembly mounted in a case formed of a laminate sheet including a resin layer and a metal layer.

The battery module according to the present invention generally has a compact structure, and structurally stable mechanical fastening and electrical connection are achieved without using a large number of members. Also, a predetermined number, such as 4, 6, 8, or 10, of battery cells or cell modules may constitute a battery module, and therefore, it is possible to effectively mount a necessary number of battery modules in a limited space.

In accordance with a further aspect of the present invention, there is provided a middle or large-sized battery pack of high power and large capacity manufactured using the battery module with the above-stated construction as a unit body.

The middle or large-sized battery pack according to the present invention may be manufactured by combining battery modules based on desired power and capacity. In consideration of installation efficiency and structural stability as previously described, the middle or large-sized battery pack according to the present invention is preferably used as a power source for electric vehicles, hybrid electric vehicles, plug-in hybrid electric vehicles, or power storage devices.

Particularly in the battery pack having the above structure, the battery cells are vertically stacked, and the total size of the battery pack is compact. Consequently, the battery pack may be mounted in a relay station of a telecommunication corporation such that the batter pack is used as an uninterruptible power supply (UPS) that supplies power in emergency.

DESCRIPTION OF DRAWINGS

The above and other objects, features and other advantages of the present invention will be more clearly understood from the following detailed description taken in conjunction with the accompanying drawings, in which.

BEST MODE

Now, preferred embodiments of the present invention will be described in detail with reference to the accompanying drawings. It should be noted, however, that the scope of the present invention is not limited by the illustrated embodiments.

Figure 1:
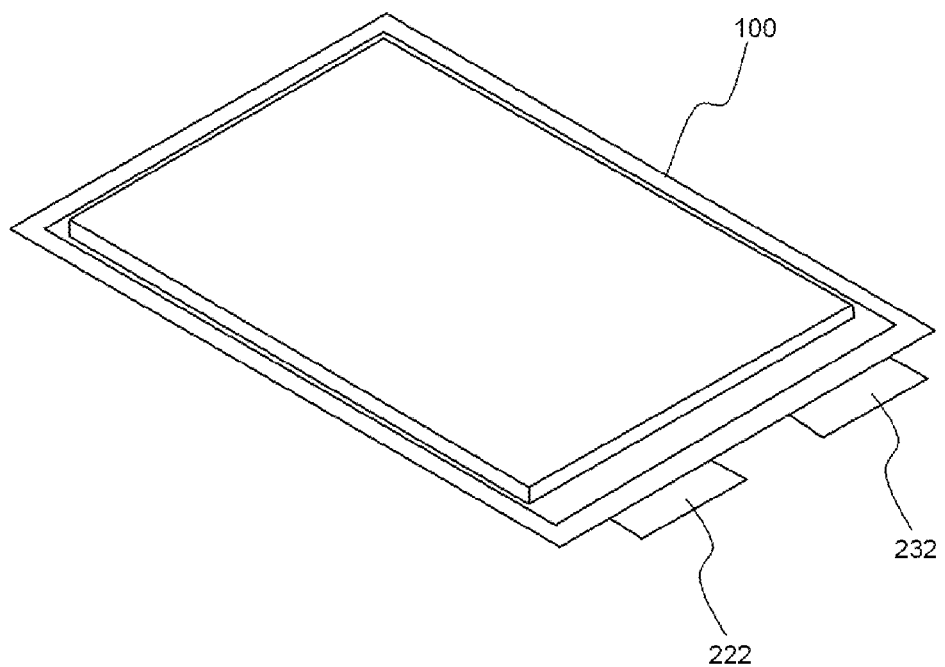
FIG. 1 is a perspective view showing a battery cell mounted in a battery module.
Figure 2:
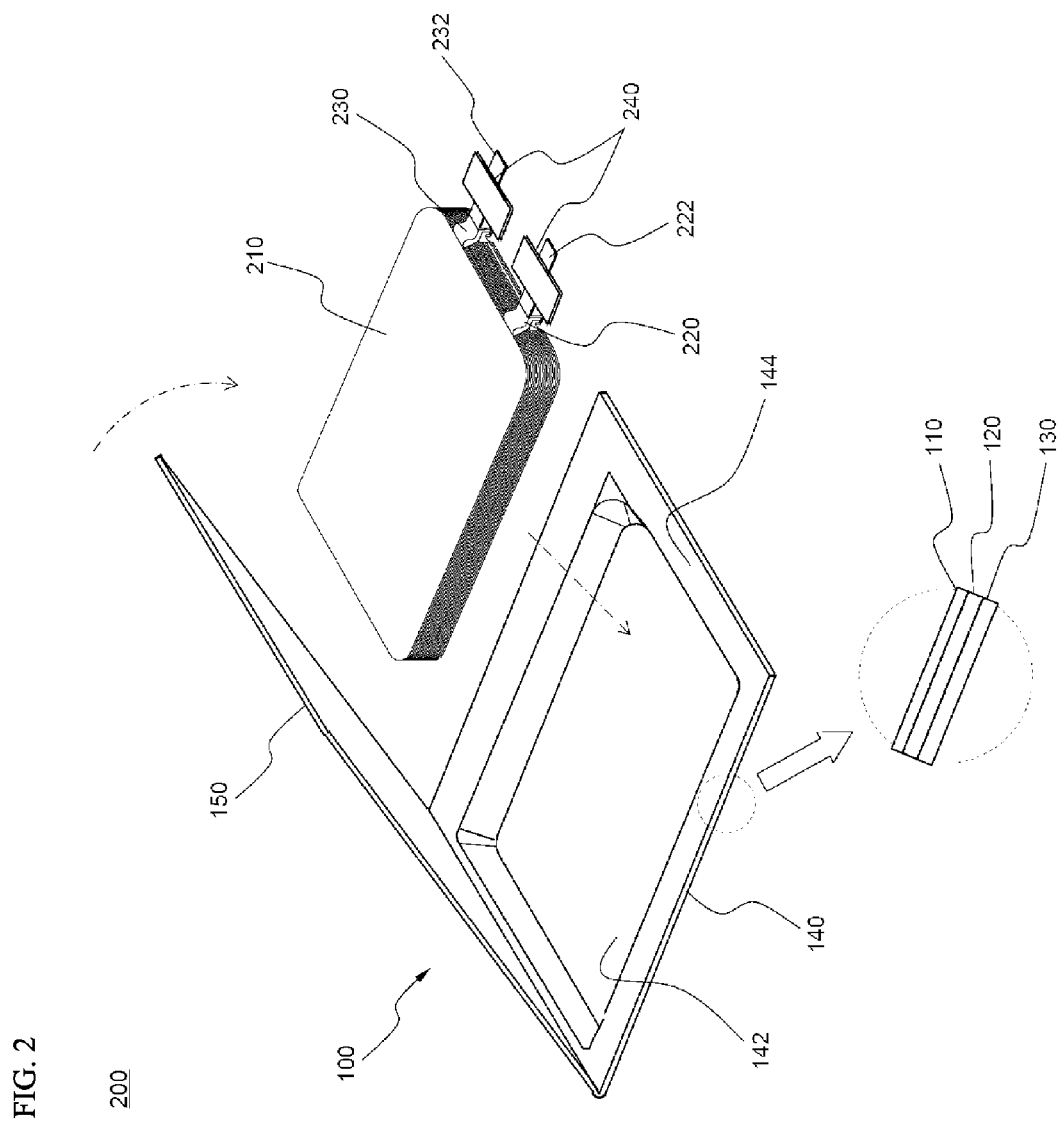
FIG. 2 is an exploded typical view of FIG. 1.

FIG. 1 is a perspective view typically showing an exemplary battery cell mounted in a unit module according to the present invention, and FIG. 2 is an exploded typical view of FIG. 1.

Referring to these drawings, a pouch-shaped battery cell 200 is configured to have a structure in which an electrode assembly 210, including cathodes, anodes, and separators disposed respectively between the cathodes and the anodes, is mounted in a pouch-shaped battery case 100 in a sealed state such that two electrode terminals 222 and 232 electrically connected to cathode and anode tabs 220 and 230 of the electrode assembly are exposed to the outside.

The battery case 100 includes a case body 140 having a depressed receiving part 142, in which the electrode assembly 210 is located, and a cover 150 integrally connected to the case body 140.

The cathode tabs 220 and the anode tabs 230 of the stacked type or stacked/folded type electrode assembly 210 are respectively coupled to the electrode terminals 222 and 232 by welding. Also, insulative films 240 are attached to the top and bottom of each of the electrode terminals 222 and 232 to prevent the occurrence of a short circuit between a thermal welding device and electrode terminals 222 and 232 and to achieve sealing between the electrode terminals 222 and 232 and the battery case 100 when a surplus part 144 of the case body 140 and the cover 150 are thermally welded to each other using the thermal welding device.

The battery case 140 and the cover 150 include outer resin layers 110, isolation metal layers 120, and inner resin layers 130. The inner resin layers 130 of the battery case 140 and the cover 150 may be tightly fixed to the each other by heat and pressure applied from the thermal welding device (not shown) to the outer surface of the battery case 140 and the outer surface the cover 150.

In a state in which the electrode assembly 210 impregnated with an electrolyte is located in the receiving part 142, contact parts between the surplus part 144 of the case body 140 and the cover 150 are thermally welded to form sealed parts.

Figure 3:
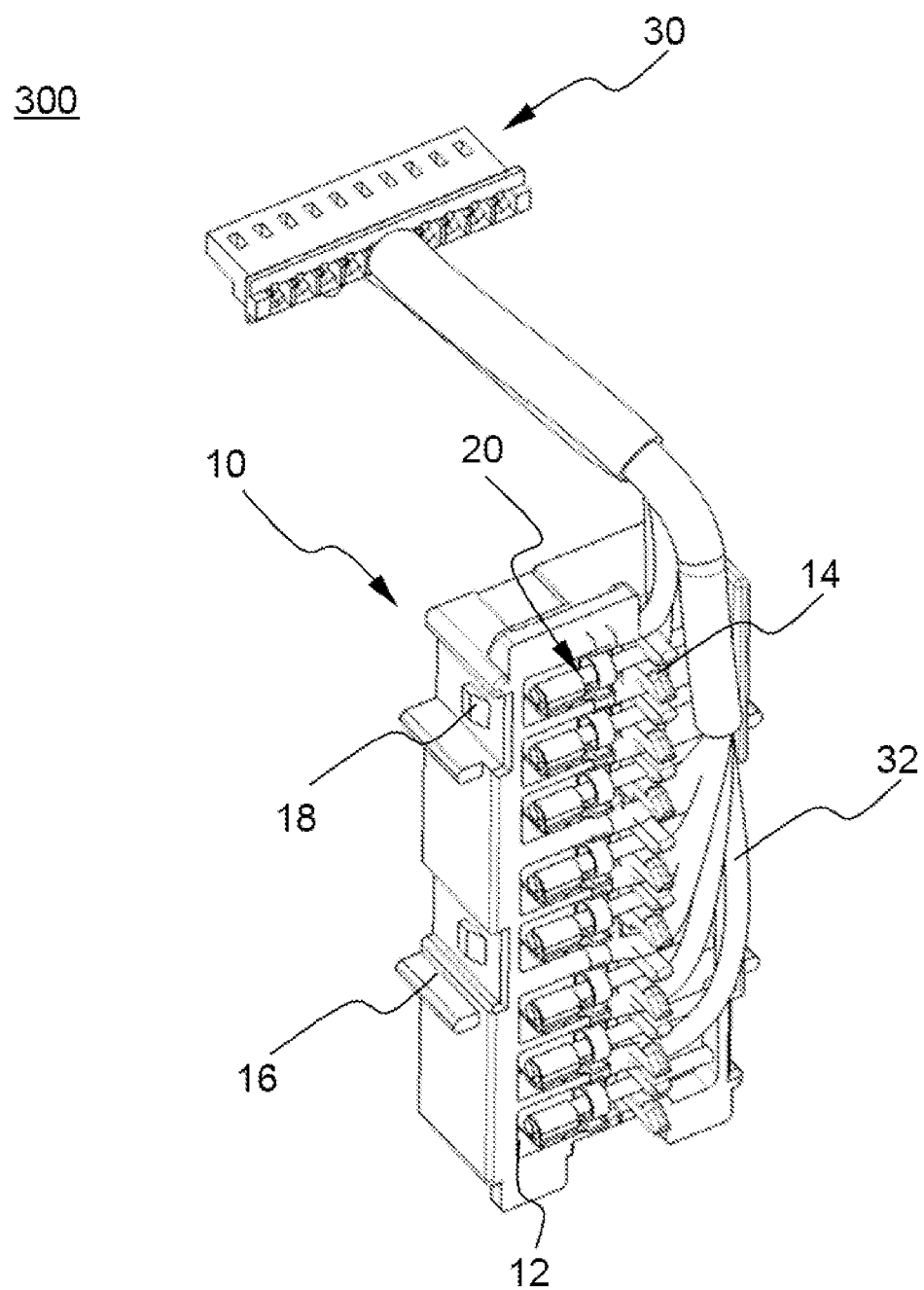
FIG. 3 is a perspective view showing a voltage sensing assembly according to an embodiment of the present invention.
Figure 4:
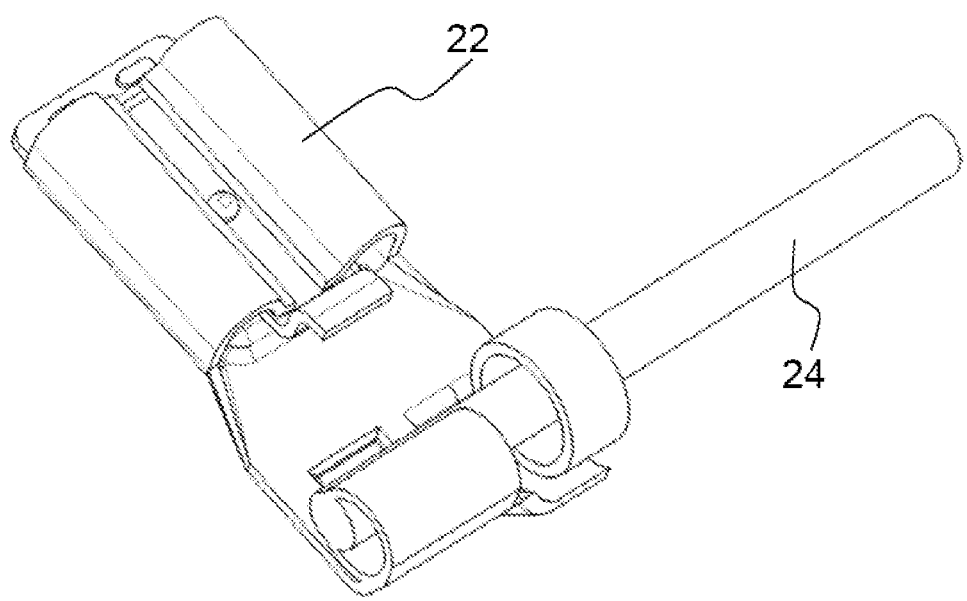
FIG. 4 is a perspective view showing a conductive sensing part of FIG. 3.

FIG. 3 is a perspective view typically showing a voltage sensing assembly according to an embodiment of the present invention, and FIG. 4 is a perspective view typically showing a conductive sensing part of FIG. 4.

Figure 6:
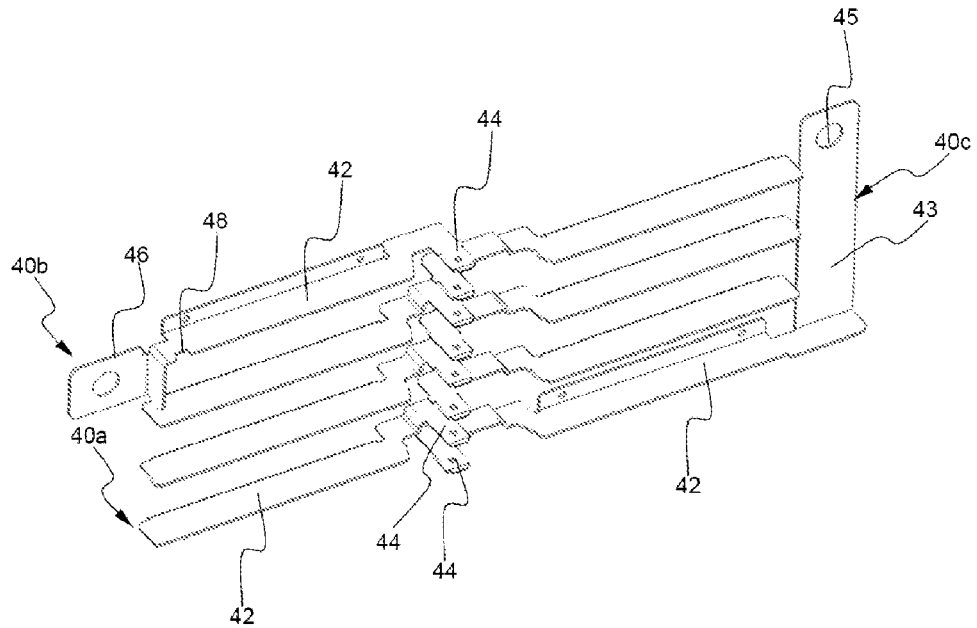
FIG. 6 is a perspective view showing bus bars mounted to the insulative mounting member of FIG. 5.
Figure 7:
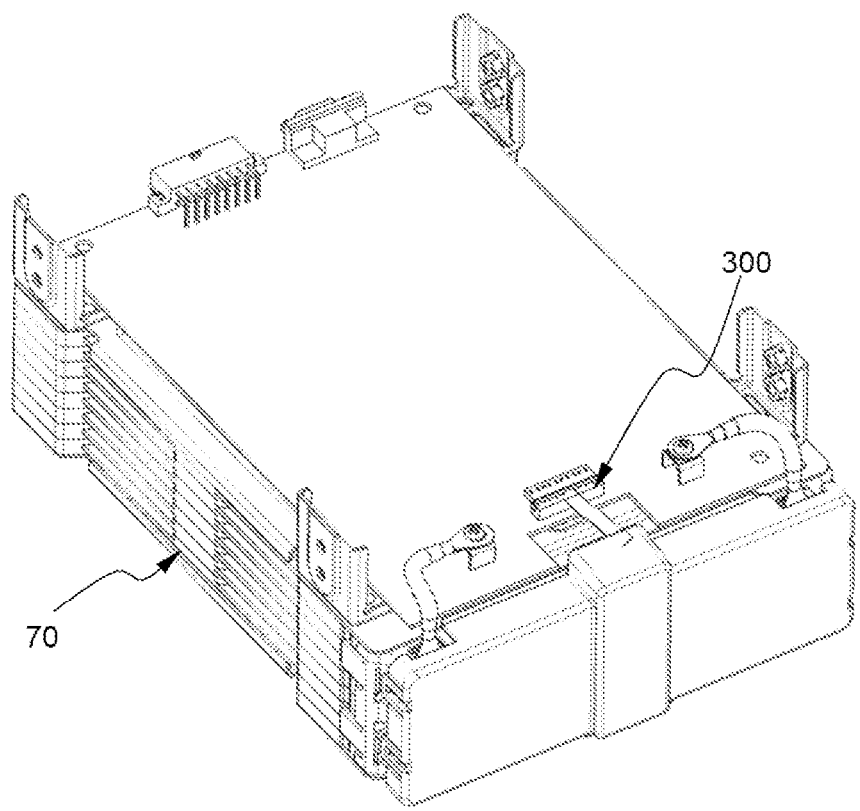
FIG. 7 is a perspective view showing a battery module according to an embodiment of the present invention.

Referring to these drawings together with FIGS. 6 and 7, a voltage sensing assembly 300 includes a block case 10 mounted to the front of a battery module 400 corresponding to electrode terminal connection parts of battery cells, conductive sensing parts 20 connected to voltage sensing terminals 44 located at one-side ends of bus bars 40a electrically connected to the electrode terminal connection parts (not shown) of the battery cells, and a connector 30 to transmit voltages sensed by the conductive sensing parts 20 to the controller.

The block case 10 includes mounting grooves 12, opened to the front, formed at positions of the block case 10 corresponding to the voltage sensing terminals 44 of the bus bars 40a such that the conductive sensing parts 20 are mounted in the mounting grooves 12. The conductive sensing parts 20 are connected to the voltage sensing terminals 44 of the bus bars 40a in a state in which the conductive sensing parts 20 are mounted in the mounting grooves 12 of the block case 10.

Also, the mounting grooves 12 of the block case 10 are individually formed for each conductive sensing part 20. Each of the conductive sensing parts 20 is configured to have a receptacle type structure in which each of the conductive sensing parts 20 is inserted into a corresponding one of the voltage sensing terminals 44 of the bus bars 40a from the front of each of the conductive sensing parts 20.

Specifically, each of the conductive sensing parts 20 includes a receptacle part 22 inserted into a corresponding one of the voltage sensing terminals 44 of the bus bars 40a and a conduction wire 24. The receptacle part 22 is connected to the conduction wire 24 in a state in which the receptacle part 22 is perpendicular to the conduction wire 24.

The conductive sensing parts 20 are connected to the connector via their wires 24. The wires 24 are wrapped with insulation tapes 32 to insulate the wires 24 from the outside.

Also, clamp-shaped fastening members 14 to stably fix the wires 24 protrude forward from the front of the block case 10.

The block case 10 is provided at opposite ends thereof with fastening protrusions 16, which protrude outward so as to be coupled into slits of the insulative mounting member 50. Above the fastening protrusions 16 are provided sliding protrusions 18, which protrude outward so as to be fastened into the inside of a voltage sensing assembly location part 54 of the insulative mounting member 50 in a sliding fashion.

Figure 5:
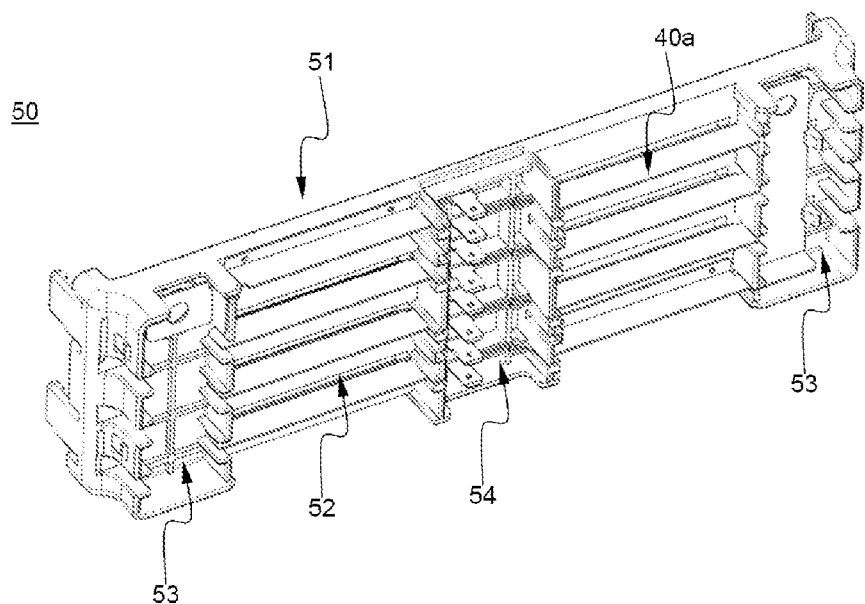
FIG. 5 is a perspective view showing an insulative mounting member in which the voltage sensing assembly of FIG. 3 is mounted.

FIG. 5 is a perspective view typically showing the insulative mounting member in which the voltage sensing assembly of FIG. 3 is mounted, and FIG. 6 is a perspective view typically showing the bus bars mounted to the insulative mounting member of FIG. 5.

Referring to these drawings together with FIG. 7, each of the bus bars 40a includes a plate-shaped body 42 electrically connected to an electrode terminal connection part of a battery cell and a voltage sensing terminal 44 formed at one end of the plate-shaped body 42.

Of the bus bars, the bus bar 40b connected to a cathode external input and output terminal further includes a first external input and output terminal connection part 46 formed at the other end of the plate-shaped body 42 opposite to the voltage sensing terminal 44 and bent so as to protrude outward from the body 42.

Between the body 42 and the first external input and output terminal connection part 46 is formed a narrow depression 48 having a vertical sectional area equivalent to 40% that of the body 42 to cause a short circuit in an overcurrent state.

Of the bus bars, the bus bar 40c connected to an anode external input and output terminal further includes a second external input and output terminal connection part 43 formed at the other end of the plate-shaped body 42 opposite to the voltage sensing terminal 44 and bent so as to protrude outward and upward from the body 42.

In the first external input and output terminal connection part 46 and the second external input and output terminal connection part 43 are formed fastening holes 45, into which the external input and output terminals are coupled.

The insulative mounting member 50 is configured to have a rectangular parallelepiped structure having the size corresponding to the front of a cell module stack 70. At the rear of the insulative mounting member 50 are formed cartridge coupling grooves 51 into which the front ends of cartridges are inserted and coupled. At opposite sides of the front of the insulative mounting member 50 are formed electrode terminal through holes 52, through which the electrode terminal connection parts of the battery cells are introduced from the rear of the insulative mounting member 50 such that the electrode terminal connection parts of the battery cells are exposed.

Also, location parts 53 for the external input and output terminal connection parts are formed at opposite ends of the front of the insulative mounting member 50 such that the external input and output terminal connection parts 46 and 43 of the bus bars 40a, 40b, and 40c are stably mounted in the location parts 53. In addition, the voltage sensing assembly location part 54 is formed at the central region of the insulative mounting member 50 such that the voltage sensing assembly 300 is stably mounted in the voltage sensing assembly location part 54.

Fastening depressions are formed at the location parts 53 for the external input and output terminal connection parts, and the electrode terminal connection parts (not shown) of the battery cells exposed forward through the electrode terminal through holes 52 are electrically connected to the upper end surfaces of the bus bars 40a mounted in the electrode terminal through holes 52.

Figure 8:
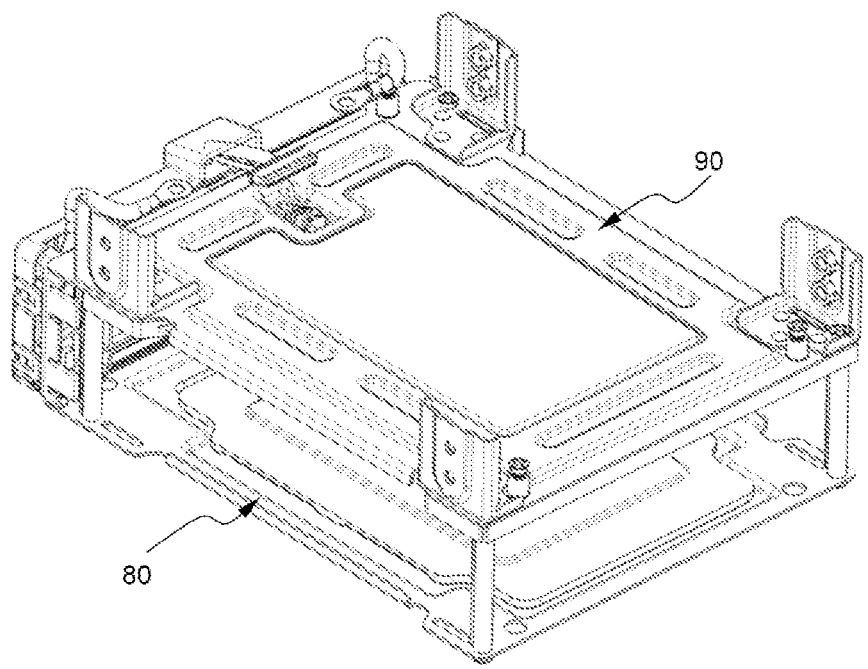
FIG. 8 is a perspective view showing the structure of the battery module of FIG. 7 excluding a cell module stack and a controller.
Figure 9:
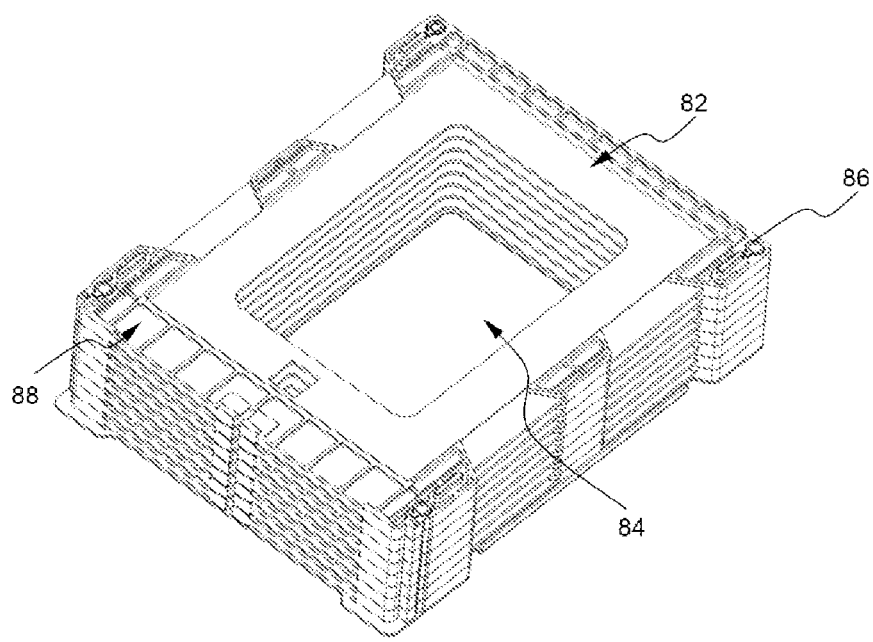
FIG. 9 is a perspective view showing a structure in which cartridges of the battery module of FIG. 7 are stacked.

FIG. 7 is a perspective view typically showing a battery module according to an embodiment of the present invention, and FIG. 8 is a perspective view typically showing the structure of the battery module of FIG. 7 excluding a cell module stack and a controller. Also, FIG. 9 is a perspective view typically showing a structure in which cartridges of the battery module of FIG. 7 are stacked.

Referring to these drawings together with FIG. 6, a battery module 400 includes a voltage sensing assembly 300, a cell module stack 70 having a structure in which a plurality of cell modules, each of which includes a battery cell mounted in a cartridge, is vertically stacked, a lower end plate 80 to support the lower end of the cell module stack 70, and an upper end plate 90 to fix an uppermost cartridge 82 of the cell module stack 70 disposed on the lower end plate 80.

Each of the cartridges 82 is configured to have a rectangular structure corresponding to a battery cell such that the battery cell can be mounted in the cartridge 82. Each of the cartridges 82 is provided at the central region thereof with a through hole 84, through which heat is dissipated. Also, fastening holes 86, through which fastening members (not shown) to fix four corners of the cell module stack 70 are inserted, are formed in four corners of each of the cartridges 82.

At the front of each of the cartridges 82 is formed a coupling part 88, to which an insulative mounting member 50 to mount the voltage sensing assembly 300 and the bus bars 40a, 40b, and 40c is fastened in an assembly fashion. Consequently, the voltage sensing assembly 300 is stably connected to the voltage sensing terminals 44 of the bus bars 40a, 40b, and 40c.

Also, the battery module 400 is configured to have a structure in which a battery cell is mounted in a cartridge 82 of each cell module, a plurality of cartridges 82 is stacked on the lower end plate 80, and the upper end plate 90 is coupled to the uppermost one of the cartridges 82.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, a voltage sensing assembly according to the present invention is manufactured using a simple assembly method without using a plurality of members for mechanical fastening and electrical connection, thereby reducing manufacturing costs of the voltage sensing assembly and achieving stable voltage sensing even when strong external impact or vibration is applied to a battery module.

Also, the voltage sensing assembly according to the present invention is configured as a separate assembly, thereby greatly improving productivity and maintenance of a battery module.

In addition, it is possible to easily manufacture a battery pack having desired power and capacity using a battery module including the voltage sensing assembly according to the present invention as a unit body.

The invention claimed is:

1. A voltage sensing assembly to detect voltages of battery cells having electrode terminals formed at an upper end or a lower end thereof in a state in which the voltage sensing assembly is mounted to a battery module, the voltage sensing assembly comprising:
   (a) a block case, formed of an electrically insulative material, mounted to a front or rear of the battery module corresponding to electrode terminal connection parts of the battery cells;
   (b) conductive sensing parts connected to voltage sensing terminals located at one-side ends of bus bars electrically connected to the electrode terminal connection parts of the battery cells; and
   (c) a connector to transmit voltages sensed by the conductive sensing parts to a controller, wherein
   the block case comprises mounting grooves, opened to a front, formed at positions of the block case corresponding to the voltage sensing terminals of the bus bars such that the conductive sensing parts are mounted in the mounting grooves, and
   the conductive sensing parts are connected to the voltage sensing terminals of the bus bars in a state in which the conductive sensing parts are mounted in the mounting grooves of the block case.

2. The voltage sensing assembly according to claim 1, wherein the mounting grooves of the block case are individually formed for each conductive sensing part.

3. The voltage sensing assembly according to claim 1, wherein each of the conductive sensing parts is configured to have a receptacle type structure in which each of the conductive sensing parts is inserted into a corresponding one of the voltage sensing terminals of the bus bars from a front of each of the conductive sensing parts.

4. The voltage sensing assembly according to claim 3, wherein each of the conductive sensing parts comprises a receptacle part inserted into a corresponding one of the voltage sensing terminals of the bus bars and a conduction wire, and the receptacle part is connected to the conduction wire in a state in which the receptacle part is perpendicular to the conduction wire.

5. The voltage sensing assembly according to claim 1, wherein the conductive sensing parts are connected to the connector via wires, and each of the wires is wrapped with insulative tape for insulation from an outside or is mounted in a tubular member.

6. The voltage sensing assembly according to claim 5, wherein the block case is provided at a front thereof with clamp-shaped fastening members protruding forward to stably fix the wires.

7. The voltage sensing assembly according to claim 1, wherein each of the bus bars comprises a plate-shaped body electrically connected to a corresponding one of the electrode terminal connection parts of the battery cells and a voltage sensing terminal formed at one end of the plate-shaped body.

8. The voltage sensing assembly according to claim 7, wherein one of the bus bars, connected to a cathode or anode external input and output terminal, further comprises a first external input and output terminal connection part formed at the other end of plate-shaped body opposite to the voltage sensing terminal and bent so as to protrude outward from the body.

9. The voltage sensing assembly according to claim 8, further comprising a depression having a small vertical sectional area formed between the body and the first external input and output terminal connection part to cause a short circuit in an overcurrent state.

10. The voltage sensing assembly according to claim 7, wherein one of the bus bars, connected to an anode or cathode external input and output terminal, further comprises a second external input and output terminal connection part formed at the other end of plate-shaped body opposite to the voltage sensing terminal and bent so as to protrude outward and upward from the body.

11. The voltage sensing assembly according to claim 8, wherein the first external input and output terminal connection part is provided with fastening holes, in which the external input and output terminals are coupled.

12. A battery module comprising:
a voltage sensing assembly according to claim 1;
a cell module stack having a structure in which a plurality of cell modules, each of which comprises a battery cell mounted in a cartridge, is vertically stacked;
a lower end plate to support a lower end of the cell module stack; and
an upper end plate to fix an uppermost cartridge of the cell module stack disposed on the lower end plate.

13. The battery module according to claim 12, wherein
each of the cartridges is configured to have a rectangular structure corresponding to each of the battery cells such that the battery cell can be mounted in the cartridge and is provided at a central region thereof with a through hole, through which heat is dissipated,
fastening holes, through which fastening members to fix the cell module stack are inserted, are formed in four corners of each of the cartridges, and
a coupling part, to which an insulative mounting member to mount the voltage sensing assembly and bus bars is fastened in an assembly fashion such that the voltage sensing assembly is stably connected to the bus bars, is formed at a front of each of the cartridges.

14. The battery module according to claim 13, wherein the insulative mounting member is configured to have a rectangular parallelepiped structure having a size corresponding to a front of the cell module stack, cartridge coupling grooves, into which front ends of the cartridges are inserted and coupled, are formed at a rear of the insulative mounting member, and electrode terminal through holes, through which the electrode terminal connection parts of the battery cells are introduced from the rear of the insulative mounting member such that the electrode terminal connection parts of the battery cells are exposed, are formed at opposite sides of a front of the insulative mounting member.

15. The battery module according to claim 13, wherein the insulative mounting member is provided at opposite ends of the front thereof with location parts for external input and output terminals, in which the external input and output terminals of the bus bars are stably mounted, and the insulative mounting member is provided at a central region thereof with a voltage sensing assembly location part, in which the voltage sensing assembly is stably mounted.

16. The battery module according to claim 15, wherein the location parts for the external input and output terminal connection parts are provided with fastening depressions.

17. The battery module according to claim 14, wherein the electrode terminal connection parts of the battery cells exposed forward through the electrode terminal through holes are electrically connected to upper end surfaces of the bus bars mounted in the electrode terminal through holes.

18. The battery module according to claim 12, wherein the battery cells are mounted in the cartridges of the cell modules, the cartridges are stacked on the lower end plate, and the upper end plate is coupled to an uppermost one of the cartridges.

19. The battery module according to claim 13, wherein the block case is provided at opposite ends thereof with fastening protrusions protruding outward so as to be coupled into slits of the insulative mounting member, and sliding protrusions protruding outward so as to be fastened into an inside of a voltage sensing assembly location part of the insulative mounting member in a sliding fashion are provided above the fastening protrusions.

20. The battery module according to claim 1, wherein each of the battery cells is a pouch-shaped battery cell having an electrode assembly mounted in a case formed of a laminate sheet comprising a resin layer and a metal layer.

21. A battery pack of high power and large capacity manufactured using a battery module according to claim 12 as a unit body.

22. The battery pack according to claim 21, wherein the battery pack is used as a power source for electric vehicles, hybrid electric vehicles, plug-in hybrid electric vehicles, or power storage devices.

23. The voltage sensing assembly according to claim 10, wherein the second external input and output terminal connection part is provided with fastening holes, in which the external input and output terminals are coupled.

* * * * *